United States Patent
Wen et al.

(10) Patent No.: US 9,461,598 B2
(45) Date of Patent: Oct. 4, 2016

(54) POWER AMPLIFIER

(71) Applicants: STMicroelectronics (Shenzhen) R&D Co. Ltd, Shenzhen (CN); STMicroelectronics S.r.l., Agrate Brianza (IT)

(72) Inventors: Kelvin Jian Wen, Shenzhen (CN); Mei Yang, Shenzhen (CN); Zheng Hua Song, Shenzhen (CN); Xian Xiong, Shenzhen (CN); Cristiano Meroni, Milan (IT)

(73) Assignees: STMICROELECTRONICS (SHENZHEN) R&D CO. LTD, Shenzhen (CN); STMICROELECTRONICS S.R.L., Agrate Brianza (IT)

( * ) Notice: Subject to any disclaimer, the term of this patent is extended or adjusted under 35 U.S.C. 154(b) by 3 days.

(21) Appl. No.: 14/613,455

(22) Filed: Feb. 4, 2015

(65) Prior Publication Data

US 2015/0381125 A1    Dec. 31, 2015

(30) Foreign Application Priority Data

Jun. 30, 2014    (CN) .......................... 2014 1 0320670

(51) Int. Cl.
     *H03F 3/45*      (2006.01)
     *H03F 3/187*      (2006.01)

(52) U.S. Cl.
     CPC .......... *H03F 3/187* (2013.01); *H03F 3/45475* (2013.01); *H03F 3/45941* (2013.01); *H03F 2200/03* (2013.01); *H03F 2200/441* (2013.01); *H03F 2203/45138* (2013.01); *H03F 2203/45418* (2013.01); *H03F 2203/45424* (2013.01); *H03F 2203/45528* (2013.01); *H03F 2203/45541* (2013.01)

(58) Field of Classification Search
     CPC .................................... H03F 3/45; H03F 3/68
     USPC ..................... 330/69, 98, 252, 261
     See application file for complete search history.

(56) References Cited

U.S. PATENT DOCUMENTS

| 4,403,201 A * | 9/1983 | Yokoyama ............... H03G 5/04 330/126 |
| 4,403,202 A * | 9/1983 | Minagawa ............. G10K 15/00 29/25.35 |
| 8,855,335 B2 * | 10/2014 | Henriksen ............ H03F 1/3211 341/118 |

OTHER PUBLICATIONS

Zhong, Guohua, et al: "Pioneering Low Cost Solution for Power Amplifiers Managing Car Engine Start-Stop Feature," 2010 IEEE (3 pages).

* cited by examiner

*Primary Examiner* — Steven J Mottola
(74) *Attorney, Agent, or Firm* — Gardere Wynne Sewell LLP

(57) ABSTRACT

A power amplifier includes a clamping circuit configured to provide a clamped voltage from a power supply; an amplifier pair having first inputs coupled to the clamping circuit, second inputs and an output for providing an amplified signal; and a biasing circuit coupled between the clamping circuit and the second inputs. The biasing circuit is configured to adjust input bias voltages of the amplifier pair such that the output of the amplifier pair varies proportionally to a change of the power supply.

25 Claims, 4 Drawing Sheets

POWER AMPLIFIER

PRIORITY CLAIM

This application claims priority from Chinese Application for Patent No. 201410320670.1 filed Jun. 30, 2014, the disclosure of which is incorporated by reference.

TECHNICAL FIELD

Example and non-limiting embodiments of this invention relate generally to a power amplifier and more particularly to a car-radio power amplifier.

BACKGROUND

In urban daily commute, especially during the peak time, people are frequently stuck in heavy traffic. In order to cut the emission of carbon dioxide of cars as well as reduce other pollutions while a car stops in traffic congestion or waits at a traffic light, most car manufacturers are introducing a start-stop engine function. With the start-stop engine function, while a car is stuck in traffic congestion, the car engine will automatically shut down, and then restart again when the car moves on as the traffic congestion clears. When the car engine restarts, a sudden high in-rush current is drawn from the car's battery, causing a rapid plunge of the battery's voltage. After the car engine has restarted, the battery returns to normal operational values. The supply voltage of a car entertainment system is derived directly from the car's battery and thus experiences a same voltage variation for the whole start-stop duration.

Usually, when the car engine is in a starting state, the capacitor of an external circuit that establishes a quiescent operating point has a fast discharge behavior. This will cause the power amplifier of a car radio system to no longer work properly. The car radio amplifier will then be set to a mute state so that no sound (including transient noise from a loudspeaker) can be heard.

Today, people are seeking a more comfortable driving experience and thus have much higher requirements for a car entertainment system than before. The interruption of the audio output is unacceptable and thus the current sound quality standard on cars does not allow this behavior even in a starting state.

In order to avoid the above mentioned problem, a well known external circuit solution is used in which a further DC (direct current)/DC regulator is used to stabilize the battery voltage during the start-stop. However, this solution requires several peripheral devices and bulky LC components, and thus causes an increased total cost, board dimension and system complexity.

Another solution has been proposed and adopted in cars, in which the minimum work supply voltage is set at a half of the power supply voltage Vcc (e.g. a half of the battery's supply voltage, for example, if the battery voltage is 12V, then Vcc/2=12V/2=6V). The typical circuit structure of this solution is shown in FIG. 1, which comprises a clamping circuit M1, a class AB amplifier M2, and a common feedback (CMFB) circuit M3. In the circuit as shown in FIG. 1, the clamping circuit M1 is configured to provide a clamped voltage Vsvr=Vcc/4 at a SVR (Supply Voltage Rejection) node to the class AB amplifier M2 as its input bias voltage. The class AB amplifier is a typical circuit structure used in a car radio system for driving a loudspeaker and usually comprises a pair of amplifiers, such as operational amplifiers, and four feedback resistors Rf1, Rf2, Re1 and Re2, which are typically coupled between respective outputs and inputs of the pair of amplifiers. Normally, resistances of resistors Rf1 and Rf2 are set equal and 20 times of the resistances of resistors Re1 and Re2, i.e. Rf1=Rf2=20Re1=20Re2. The common mode feedback circuit M3 is interposed between the outputs of the pair of amplifiers and corresponding inputs thereof to absorb the quiescent current from the output to the input. With this CMFB, the outputs of the pair of amplifiers can be kept at Vcc/2 and the alternating current (AC) gain of outputs OUTP and OUTM of the pair of amplifiers can be maintained equal. In this solution, the inputs to both amplifiers are biased at one fourth of the power supply (i.e. Vcc/4), while the outputs of the two amplifiers are biased at the half power supply (i.e. Vcc/2), so that when the power supply drops from Vcc to Vcc/2 in a starting state, the outputs of the amplifiers are reduced proportionally to the reduction of the power supply and thus the whole amplifier can still operate normally.

However, although the solution with the CMFB can solve the start-stop problem, it additionally introduces a positive feedback loop which may greatly affects the stability of the whole radio system especially when a car is powered up. For example, if the external load is a capacitive load, e.g. with a capacitance of 10 nF, this circuit may cause an unwanted oscillation. In the actual application, the external capacitance cannot be avoided. For example, for a loudspeaker with a resistance of 2 ohm the oscillation may occur unless the capacitance induced by the loudspeaker is less than 2 nF, but it is not practical.

SUMMARY

Example embodiments provide a new car radio power amplifier. The proposed power amplifier removes the common mode feedback circuit and thus avoids the possibility of causing an oscillation even when a large capacitive load is connected and thereby makes the car radio system more stable.

A first aspect relates to a power amplifier, comprising: a clamping circuit (N1) configured to provide a clamped voltage from a power supply; an amplifier pair (N2) having a first plurality of inputs coupled to the clamping circuit, an output for providing an amplified signal and a second plurality of inputs; and a biasing circuit (N3) coupled between the clamping circuit and the second plurality of inputs of the amplifier pair, and configured to adjust input bias voltages of the amplifier pair such that the output of the amplifier pair varies proportionally to a change of the power supply.

A second aspect relates to a method for adjusting a bias voltage of a power amplifier that includes a clamping circuit, a biasing circuit and an amplifier pair, the method comprising: providing a clamped voltage from a power supply by the clamping circuit; adjusting input bias voltages of the amplifier pair by the biasing circuit such that the output of the amplifier pair varies proportionally to a change of the power supply; and providing an amplified signal by the amplifier pair.

A third aspect relates to a biasing circuit, comprising: a first buffer and a second buffer each having at least one input and an output, wherein an input of the first buffer is coupled to an input node; the output of the first buffer is coupled via a first resistor to a first input of the second buffer; the input node is coupled to a second input of the second buffer; a second resistor is connected between the output and the first input of the second buffer; and the output of the second buffer is coupled to a plurality of bias resistors respectively.

BRIEF DESCRIPTION OF DRAWINGS

The invention itself, preferable modes of use and further objectives are best understood by reference to the following detailed description of the embodiments when read in conjunction with the accompanying drawings, wherein like reference numerals generally refer to like elements in the embodiments of the present disclosure, wherein.

DETAILED DESCRIPTION OF EMBODIMENTS

Some preferred embodiments will be described in more detail with reference to the accompanying drawings, in which the preferred embodiments of the present disclosure have been illustrated. However, the present disclosure can be implemented in various manners, and thus should not be construed to be limited to the embodiments disclosed herein. On the contrary, those embodiments are provided for thorough and complete understanding of the present disclosure, and completely conveying the scope of the present disclosure to those skilled in the art.

Hereinafter, various embodiments and implementations of the present invention and its aspects are described using several alternatives. It is generally noted that, according to certain needs and constraints, all of the described alternatives may be provided alone or in any conceivable combination (also including combinations of individual features of the various alternatives).

Figure 1:
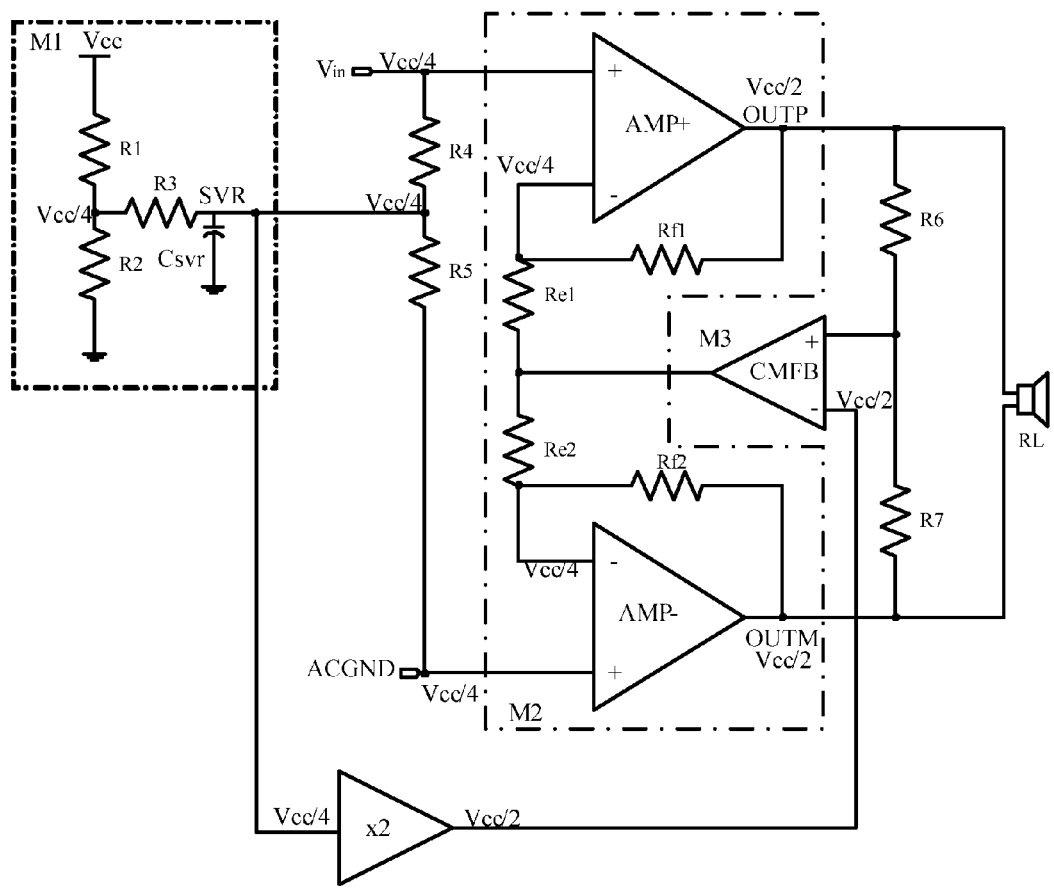
FIG. 1 is a schematic diagram illustrating a power amplifier circuit with the CMFB in the prior art.
Figure 2:
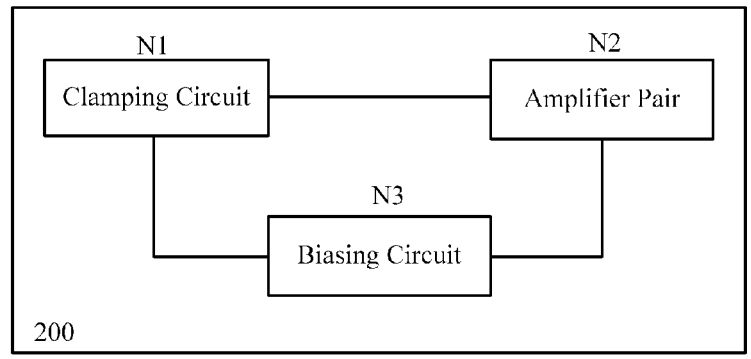
FIG. 2 is a block diagram illustrating a power amplifier according to an embodiment.

Reference is first made to FIG. 2, in which a block diagram of a power amplifier according to an embodiment is illustrated. As shown in FIG. 2, the proposed car radio power amplifier circuitry mainly comprises three blocks, i.e. a clamping circuit N1, an amplifier pair (e.g. a class AB amplifier) N2 and a biasing circuit N3. The clamping circuit N1 and the amplifier pair N2 are similar to those as shown in FIG. 1.

Figure 3:
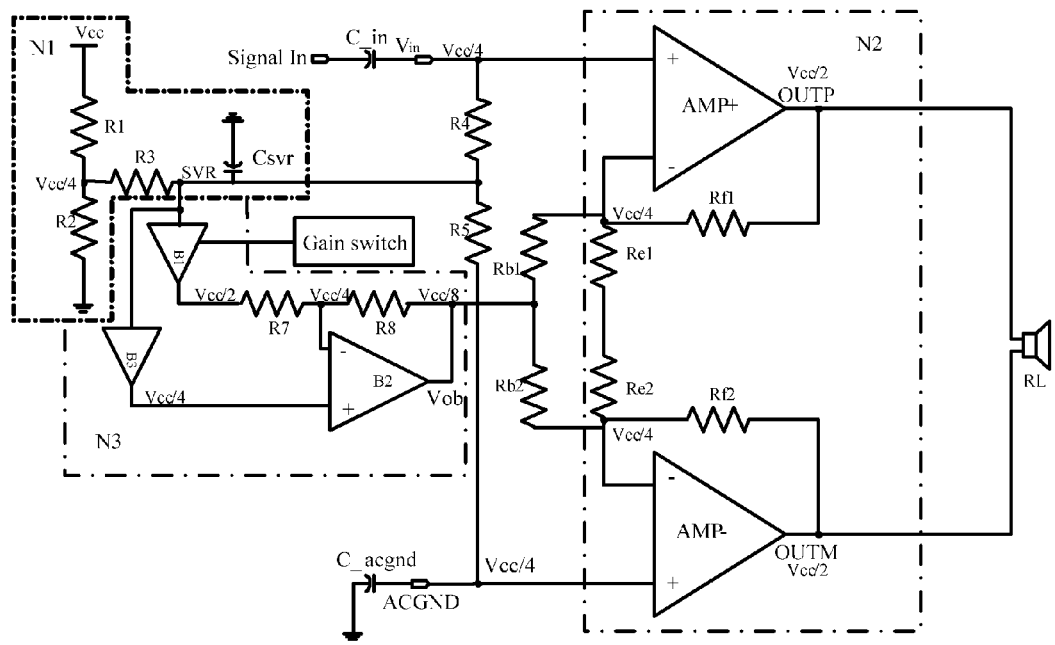
FIG. 3 is a schematic diagram illustrating a power amplifier according to an embodiment.

The description of each block N1, N2, N3 will be detailed hereafter with reference to FIG. 3, in which a schematic diagram of the power amplifier circuitry according to an embodiment will be illustrated.

As shown in FIG. 3, the clamping circuit N1 may include two serially connected resistors R1 and R2 between the power supply (Vcc) and the ground. In one embodiment, preferably the resistance of the resistor R1 may be set to 3 times of the resistance of R2, i.e. R1=3R2. In this preferable case, the divided voltage between the resistors R1 and R2 is Vcc/4, which may be coupled to a SVR (Supply Voltage Rejection) node, for example, via a resistor R3. The SVR node may be coupled to the ground via a large outside capacitor $C_{svr}$, which typically has a value of 10 μF. Because of this large capacitor, when the power supply drops, for example from Vcc to Vcc/2, the voltage at the SVR node can still remain at about Vcc/4 without discharging quickly. This clamped voltage may in turn be coupled to non-inverting inputs of two amplifiers AMP+ and AMP− of the amplifier pair N2 respectively via two bias resistors R4 and R5, so as to provide the amplifier input bias voltages.

Although FIG. 3 shows two resistors R1 and R2, a person skilled in the art will understand that the number of resistors R1 and R2 is not limited to two, and rather any number of resistors can be adopted as long as they can divide the power supply as required.

The amplifier pair N2 is configured as illustrated above with reference to FIG. 1 and usually comprises a pair of amplifiers (i.e., a first amplifier AMP+ and a second amplifier AMP−) and four feedback resistors Rf1, Rf2, Re1 and Re2, which are typically coupled between respective outputs and inputs of the pair of amplifiers. In one embodiment, preferably the resistance of the resistor Rf1 may be set to 16 times of the resistance of the resistor Re1, i.e. Rf1=16Re1, and the resistance of Rf2 may be set to 20 times of the resistance of the resistors Re1 and Re2, i.e. Rf2=20Re1=20Re2. However, a person skilled in the art will understand that the present invention is limited to any specific number of the feedback resistors and any specific resistances, which may be adjusted according to practical application and performance requirements.

In practical applications, an input, e.g. an audio signal may be input to the first input, i.e. the non-inverting input, of the first amplifier AMP+ via a capacitor C_in. The capacitor C_in may filter out the DC component of the audio signal and a net signal may be input to the non-inverting input of the amplifier AMP+. The AC ground (ACGND) may be coupled to the first input, i.e. the non-inverting input, of the second amplifier AMP− via a capacitor C_acgnd. Both capacitors C_in and C_acgnd may be external coupling capacitors and typically have a value of 220 nF.

Compared with the amplifier as shown in FIG. 1, the power amplifier circuitry according to embodiments further comprises a biasing circuit N3.

In one embodiment, this biasing circuit N3 may comprise two buffer amplifiers (or simplified as buffers) B1 and B2 each having at least one input and an output.

An input of the buffer amplifier B1 is coupled to the input node, i.e. the SVR node and the output of the buffer amplifier B1 is coupled to a first input (i.e. the inverting input) of the buffer amplifier B2. In this embodiment, the buffer B1 may be configured to amplify the voltage Vsvr at the SVR node, for example by two times, when the power amplifier circuitry is operating normally (i.e. the power supply remains unchanged at Vcc), and to transfer the voltage at its input, i.e. Vsvr, to the output without amplification so as to get a voltage of Vsvr at its output, when the power supply drops, e.g. from Vcc to Vcc/2. Whether the buffer amplifier B1 amplifies, the input voltage may be switched according to the control of an internal gain switch circuit. For example, if the voltage reduction of the power supply exceeds a threshold, then the internal gain switch circuit may trigger the buffer B1 to switch from an amplifier with a two times gain to an amplifier with a unity gain.

Additionally, a resistor R7 may be further coupled between the output of the buffer amplifier B1 and the first input (i.e. the inverting input) of the buffer amplifier B2. By means of this arrangement, the voltage at the SVR node may be coupled to the first input of the buffer amplifier B2 via the buffer amplifier B1 and the resistor R7.

A second input (i.e. the non-inverting input) of the buffer amplifier B2 may be coupled (for example, directly) to the SVR node.

A feedback resistor R8 may be coupled between the first input and the output Vob of the amplifier buffer B2. In this embodiment, preferably the resistance of the resistor R7 may be set to 2 times of the resistance of the resistor R8, i.e. R7=2R8.

The output Vob of the amplifier buffer B2 may in turn be coupled respectively via two bias resistors Rb1 and Rb2 to the inverting inputs of the two amplifiers AMP+ and AMP− of the amplifier pair N2 so as to provide the bias voltages for the pair of amplifiers.

The two serial bias resistors Rb1 and Rb2 may be connected in parallel with the feedback resistors Re1 and Re2 between the inverting inputs of the pair of amplifiers AMP+ and AMP−. In this embodiment, preferably the resistance of Rb1 may be set to a half of Rf1, i.e. Rf1=2Rb1, and the resistance of Rb2 may be set to a half of Rf2, i.e. Rf2=2Rb2.

In another embodiment, the biasing circuit N3 may further comprise another buffer amplifier B3 coupled between the SVR node and the second input (i.e. the non-inverting input) of the buffer amplifier B2. The buffer amplifier B3 is used for transferring a voltage at the input, i.e. at the SVR node, to a circuit following thereto, i.e. the buffer amplifier B2. As an example, the buffer amplifier B3 may be implemented as a buffer amplifier with a unity gain and constructed by connecting the output of an op-amp to its inverting input, and connecting a signal source to the non-inverting input. Ideally, the input resistance of the buffer amplifier B3 is infinite, and its output resistance is zero so that the buffer amplifier B3 may prevent the following circuit B2 from loading the previous circuit unacceptably and interfering with its desired operations.

In an example with the above described structure, in which R1=3R2, R4=R5, Rf1=2Rb1=16Re1, Rf2=2Rb2=20Re1=20Re2, and R7=2R8 are set, when the power amplifier circuitry is operating normally, i.e. the power supply remains at Vcc without dropping, the voltage at the SVR node Vsvr is Vcc/4 and due to the intrinsic characteristics of the amplifiers AMP+ and AMP−, all inputs of these amplifiers are biased at Vcc/4. Meanwhile, the non-inverting input of the buffer amplifier B2 is Vcc/4 and the inverting input of the amplifier buffer B2 is also Vcc/4 according to the characteristics of the operational amplifier. The buffer amplifier B1 amplifies its input by two times and outputs 2Vsvr, i.e. Vcc/2, when the power supply voltage is normal. Considering the proportional relation between R7 and R8, the output Vob of the buffer amplifier B2 will be Vcc/8. Then, the bias voltages at the outputs of the amplifiers AMP+ and AMP− may thus be obtained as Vcc/4+(Vcc/4−Vcc/8)×Rf1/Rb1=Vcc/2 and Vcc/4+(Vcc/4−Vcc/8)×Rf2/Rb2=Vcc/2. That is, both outputs OUTP and OUTM of the amplifier pair are biased at Vcc/2.

In this example, the AC gain of the first amplifier AMP+ is (Rf1/(Rb1(Re1+Re2)/(Rb1+Re1+Re2)))=10, and the AC gain of the second amplifier AMP− is −(Rf2/(Re1+Re2))=−10. Thus, the total 26 dB AC gain can be obtained. A person skilled in the art shall understand that the AC gain may be changed according to requirements by adjusting the resistances of the feedback resistors Rf1, Rf2, Re1 and Re2 and the biasing resistors Rb1 and Rb2. The present invention is not limited to any specific settings.

In the above example, during the start-stop process, the power supply drops from Vcc to Vcc' (e.g. Vcc'=Vcc/2). Due to the connected large capacitor Csvr at the SVR node, the clamped voltage Vsvr at the SVR node still remains at Vcc/4. Thus, the non-inverting and inverting inputs of the buffer amplifier B2 remain at Vcc/4. At this point, due to the power supply voltage drop, the buffer amplifier B1 is triggered by the internal circuit (not shown) to operate as a unity gain amplifier and thus output a voltage approximately equal to Vsvr, i.e. Vcc/4. In this case, the voltage across the resistor R7 is zero and thus no current flows through the resistors R7 and R8. As a result, the output Vob of the buffer amplifier B2 is now increased to Vcc/4. In turn, the voltage across Rb1 is also zero and no current flows through Rb1 and thus the DC output of the first amplifier AMP+ of the amplifier pair N2 is also Vcc/4=Vcc'/2. That is, the current output bias voltage of the OUTP is still a half of the current power supply Vcc'. Similarly, the current output bias voltage of the OUTM is also a half of the current power supply Vcc'. Therefore, the DC output of the amplifier pair, or the output bias voltage of the whole power amplifier circuitry, reduces proportionally to the reduction of the power supply, which guarantees the proper operation of the whole power amplifier circuitry.

Figure 4:
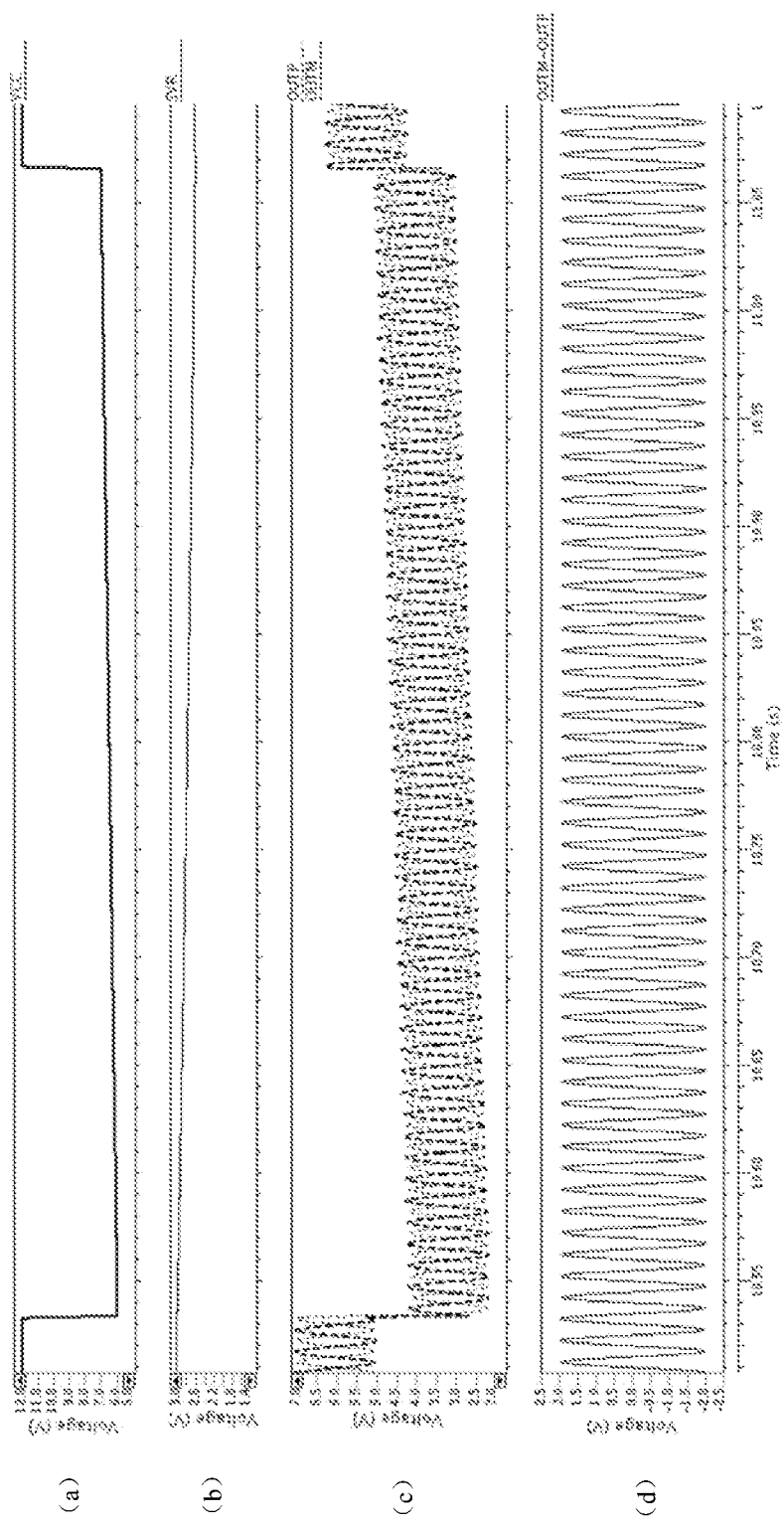
FIG. 4 shows simulation results of an example of a power amplifier according to an embodiment.

FIG. 4 shows simulation results illustrating the performance of an example of a power amplifier circuitry according to embodiments of the present invention. In this simulation, the normal power supply Vcc is set to 12V and then drops to 6V when the car engine restarts. It can be seen from FIG. 4 that when the power supply cranks from 12V to 6V (as shown in waveform (a)), the bias voltage of the power amplifier circuitry is adjusted from 6V to 3V (as shown in waveform (c)), while the clamped voltage Vsvr is kept around 3V (as shown in waveform (b)) and the AC gains of the two amplifiers in the power amplifier circuitry are equal (as shown in waveform (c)). Thus, the total AC output of the amplifier circuitry remains stable (as illustrated in waveform (d)). Additionally, some key parameters for performance evaluation, such as THD (total harmonic distortion), noise, and 'pop' noise of the proposed power amplifier circuitry according to embodiments are almost the same as a conventional circuit as shown in FIG. 1.

An advantage of the power amplifier circuitry according to embodiments lies in that the proposed power amplifier circuitry removes the common mode feedback circuit, and the same feedback for both OUTP and OUTM can be obtained by adjusting the resistances of the biasing and feedback resistors. With the omission of the CMFB circuit, the positive feedback loop is removed such that the car radio system may be more stable, even when a large capacitive load is connected.

Another advantage of the power amplifier circuitry according to embodiments lies in that the conventional circuit as shown in FIG. 1 has a 20 times DC gain for AMP+ and AMP− from CMFB output, thus the mismatch of the feedback resistors Re1, Rf1, Re2 and Rf2 will be also enlarged 20 times, resulting in a big offset; while the power amplifier circuitry according to embodiments of the present invention has a only 2 times DC gain from the output Vob of the buffer B3 through the bias resistor Rb1 and the feedback resistor Rf1 or through Rb2 and Rf2 to the output of the power amplifier circuitry, thus the mismatch of the resistors Rb1 and Rf1 or Rb2 and Rf2 will not be enlarged, resulting in the DC offset 20 times smaller than the conventional circuit as shown in FIG. 1. The quiescent current of the power amplifier circuitry also becomes about 4% smaller.

Figure 5:
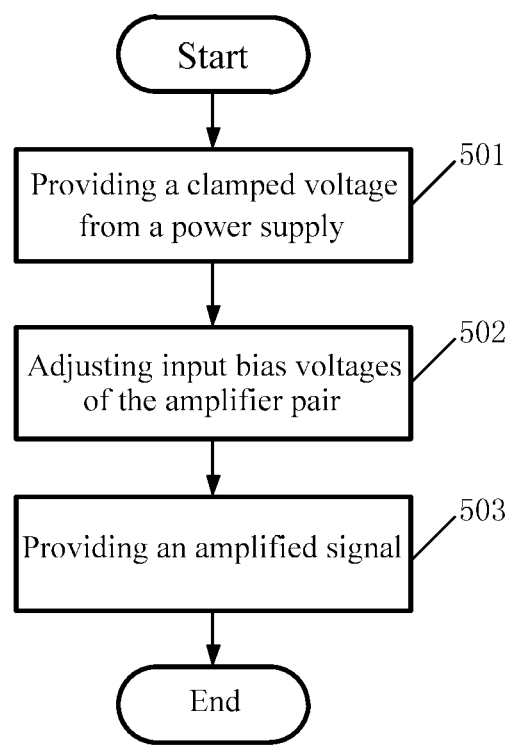
FIG. 5 is a flowchart illustrating a method for adjusting a bias voltage of a power amplifier circuitry according to an embodiment.

FIG. 5 is a flowchart illustrating a method for adjusting bias voltages of a power amplifier circuitry. The power amplifier circuitry has the structure as shown in FIG. 3 and comprises a clamping circuit N1, a biasing circuit N3 and an amplifier pair N2. As shown in FIG. 5, in block 501, a clamped voltage obtained from a power supply, e.g. Vsvr, is provided by the clamping circuit N1. In block 502, according to a change of the power supply, input bias voltages of the amplifier pair N2 are adjusted by the biasing circuit N3 such that an output of the amplifier pair varies proportionally to the change of the power supply. In block 503, an amplified signal is output by the amplifier pair.

Exemplary embodiments have been described above with reference to schematic diagrams and flowchart illustrations of methods. It will be understood that each block of the flowchart illustrations, and combinations of blocks in the flowchart illustrations, respectively, can be implemented by various means, not limited to any specific embodiment as disclosed.

Many modifications and other embodiments set forth herein will come to mind to one skilled in the art to which these embodiments of the invention pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A power amplifier, comprising:
    a clamping circuit configured to provide a clamped voltage from a power supply at a supply voltage rejection node;
    a biasing circuit comprising a differential buffer circuit having a first input coupled to receive a first voltage derived from the clamped voltage and a second input coupled to receive a second voltage derived from the clamped voltage, said differential buffer circuit having an output generating a bias voltage; and
    an amplifier pair having a first plurality of inputs coupled to the clamped voltage at the clamping circuit, an output for providing an amplified signal, and a second plurality of inputs; and
    wherein the bias voltage generated at the output of the differential buffer circuit is coupled to the second plurality of inputs of the amplifier pair to adjust input bias voltages of the amplifier pair such that the output of the amplifier pair varies proportionally to a change of the power supply.

2. A power amplifier, comprising:
    a clamping circuit configured to provide a clamped voltage from a power supply;
    wherein the clamping circuit comprises two or more dividing resistors for dividing a voltage of the power supply;
    an amplifier pair having a first plurality of inputs, an output for providing an amplified signal, and a second plurality of inputs;
    wherein the voltage divided by the dividing resistors is coupled to a supply voltage rejection node that is further coupled via a first plurality of bias resistors respectively to the first plurality of inputs of the amplifier pair; and
    wherein the supply voltage rejection node is coupled via a capacitor to the ground so as to provide the clamped voltage at the supply voltage rejection node; and
    a biasing circuit coupled between the clamping circuit and the second plurality of inputs of the amplifier pair, and configured to adjust input bias voltages of the amplifier pair such that the output of the amplifier pair varies proportionally to a change of the power supply.

3. The power amplifier according to claim 2,
    wherein the biasing circuit comprises at least a first buffer and a second buffer each having at least one input and an output,
    wherein an input of the first buffer is coupled to the supply voltage rejection node;
    wherein the output of the first buffer is coupled via a first resistor to a first input of the second buffer;
    wherein the supply voltage rejection node is coupled to a second input of the second buffer;
    wherein a second resistor is connected between the output and the first input of the second buffer; and
    wherein the output of the second buffer is coupled via a second plurality of bias resistors respectively to the second plurality of inputs of the amplifier pair.

4. The power amplifier according to claim 3, wherein the first buffer is configured to amplify the clamped voltage when the power supply remains unchanged and to output the clamped voltage as it is when the power supply drops.

5. The power amplifier according to claim 3, wherein the biasing circuit further comprises a third buffer coupled between the supply voltage rejection node and the second input of the second buffer.

6. The power amplifier according to claim 1, wherein the amplifier pair is configured into a class AB amplifier.

7. A method for adjusting a bias voltage of a power amplifier that comprises a clamping circuit, an amplifier pair and a biasing circuit, comprising:
    providing a clamped voltage from a power supply by the clamping circuit;
    adjusting input bias voltages of the amplifier pair by the biasing circuit such that an output of the amplifier pair varies proportionally to a change of the power supply; and
    providing an amplified output by the amplifier pair;
    wherein adjusting the input bias voltages comprises:
        differentially comparing a first voltage derived from the clamped voltage and a second voltage derived from the clamped voltage to generate a bias voltage;
        applying the clamped voltage to a plurality of first inputs of the amplifier pair; and
        applying the bias voltage to a plurality of second inputs of the amplifier pair.

8. A method for adjusting a bias voltage of a power amplifier that comprises a clamping circuit, an amplifier pair and a biasing circuit, comprising:
    providing a clamped voltage from a power supply by the clamping circuit, wherein providing the clamped voltage further comprises:
        dividing a voltage of the power supply by two or more dividing resistors;
        coupling the voltage divided by the dividing resistors to a supply voltage rejection node that is further coupled via a plurality of bias resistors to the amplifier pair; and
        providing the clamped voltage by coupling the supply voltage rejection node via a capacitor to the ground;
    adjusting input bias voltages of the amplifier pair by the biasing circuit such that an output of the amplifier pair varies proportionally to a change of the power supply; and
    providing an amplified output by the amplifier pair.

9. The method according to claim 8, wherein adjusting the input bias voltages further comprises:
    when the power supply remains unchanged, maintaining the input bias voltages of the amplifier pair, and when the power supply drops, decreasing the input bias voltages of the amplifier pair such that the output bias voltage of the amplifier pair decreases proportionally to the change of the power supply.

10. The method according to claim 7, wherein the amplifier pair is configured into a class AB amplifier.

11. A biasing circuit, comprising:
a first buffer and a second buffer each having at least one input and an output,
wherein an input of the first buffer is coupled to an input node and the output of the first buffer is coupled via a first resistor to a first input of the second buffer;
wherein the input node is coupled to a second input of the second buffer;
wherein a second resistor is connected between the output and the first input of the second buffer; and
wherein the output of the second buffer is coupled to a plurality of bias resistors, respectively; and
a third buffer coupled between the input node and the second input of the second buffer.

12. The biasing circuit according to claim 11, wherein the first buffer is controlled to amplify a voltage at the input node or to output the voltage as it is.

13. A circuit, comprising:
an audio amplifier circuit having an audio signal input and a bias signal input; and
a bias circuit having an output coupled to the bias signal input of the audio amplifier;
wherein the bias circuit comprises:
    a circuit configured to generate from a supply voltage a first voltage at a supply voltage rejection node;
    a first buffer circuit having an input coupled to the supply voltage rejection node, said first buffer circuit configured to operate with a variable gain to generate a second voltage from said first voltage; and
    a differential amplifier circuit having a first input coupled to receive said first voltage and a second input configured to receive said second voltage, wherein an output of the differential amplifier circuit generates a bias signal for application to said bias signal input.

14. The circuit of claim 13, wherein the variable gain comprises a switched gain including a unity gain setting and a non-unity gain setting.

15. The circuit of claim 14, wherein the said first buffer circuit operates with the unity gain setting when said supply voltage is at a first voltage level and operates with the non-unity gain when said supply voltage is at a second voltage level.

16. The circuit of claim 15, wherein the first voltage level is less than the second voltage level.

17. The circuit of claim 13, further comprising a second buffer circuit coupled between the supply voltage rejection node and the first input of the differential amplifier circuit.

18. The circuit of claim 13, further comprising a capacitor coupled between the supply voltage rejection node and a reference supply node.

19. The power amplifier according to claim 1, further comprising:
a plurality of bias resistors configured to apply the clamped voltage respectively to the first plurality of inputs of the amplifier pair; and
a capacitor coupled between the supply voltage rejection node an ground.

20. The power amplifier according to claim 1, wherein the biasing circuit further comprises a first buffer having an input coupled to the supply voltage rejection node and an output coupled to the first input of the differential buffer circuit.

21. The power amplifier according to claim 20, wherein the first buffer is configured to amplify the clamped voltage at a first power supply level and is further configured to not amplify the clamped voltage at a second power supply level lower than the first power supply level.

22. The power amplifier according to claim 21, wherein the biasing circuit further comprises a second buffer coupled between the supply voltage rejection node and the second input of the differential buffer circuit.

23. The power amplifier according to claim 1, further comprising a plurality of bias resistors configured to apply the bias voltage respectively to the second plurality of inputs of the amplifier pair.

24. The power amplifier according to claim 1, wherein the amplifier pair is configured as a class AB amplifier.

25. The method according to claim 7, wherein adjusting the input bias voltages further comprises:
amplifying the clamped voltage to generate the first voltage when the power supply is at a first power supply level; and
not amplifying the clamped voltage to generate the first voltage when the power supply is at a second power supply level less than the first power supply level.

* * * * *